United States Patent [19]
Guidash et al.

[11] Patent Number: 5,621,230
[45] Date of Patent: Apr. 15, 1997

[54] LOW CAPACITANCE FLOATING DIFFUSION STRUCTURE FOR A SOLID STATE IMAGE SENSOR

[75] Inventors: Robert M. Guidash, Rush; Antonio S. Ciccarelli, Rochester, both of N.Y.

[73] Assignee: Eastman Kodak Company, Rochester, N.Y.

[21] Appl. No.: 675,328

[22] Filed: Jun. 27, 1996

Related U.S. Application Data

[63] Continuation of Ser. No. 491,791, Jun. 19, 1995, abandoned, which is a continuation of Ser. No. 298,893, Aug. 31, 1994, abandoned, which is a division of Ser. No. 188,500, Jan. 26, 1994, Pat. No. 5,387,536.

[51] Int. Cl.⁶ .................................................. H01L 27/148
[52] U.S. Cl. ........................... 257/222; 257/239; 257/223
[58] Field of Search ............................. 437/155; 257/773, 257/751, 222, 239, 216, 223

[56] References Cited

U.S. PATENT DOCUMENTS

| | | | |
|---|---|---|---|
| 4,594,604 | 6/1986 | Kub | 357/24 |
| 5,151,380 | 9/1992 | Hynecek | 437/53 |
| 5,341,008 | 8/1994 | Hynecek | 257/231 |

OTHER PUBLICATIONS

Miwada et al, A 100 MHZ Data Rate, 5000-Element CCD Linear Image Sensor with Reset Pulse Level Adjustment Circuit, IEEE International Solid State Circuits Conference 1992, pp. 168–169, 275 no month.

*Primary Examiner*—Jerome Jackson
*Assistant Examiner*—Nathan K. Kelley
*Attorney, Agent, or Firm*—James D. Leimbach

[57] ABSTRACT

A method for producing a low capacitance floating diffusion structure used for charge to voltage conversion in a solid state image sensor having an output amplifier provided with a gate electrode, comprising the steps of: (a) growing a gate oxide on a substrate of a given conductivity type; (b) forming the gate electrode for the output amplifier on the gate oxide and patterning the gate electrode so as to create an opening through it; (c) introducing through the opening a dopant of a conductivity type opposite to the given conductivity type so as to create a floating diffusion region in the substrate; and (d) creating an ohmic contact between the floating diffusion region and the gate electrode.

7 Claims, 5 Drawing Sheets

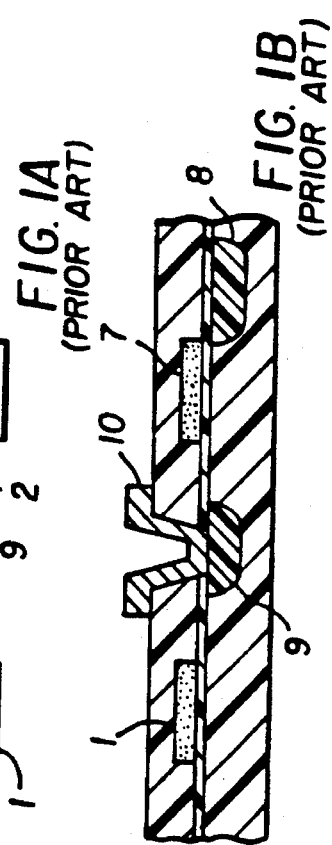
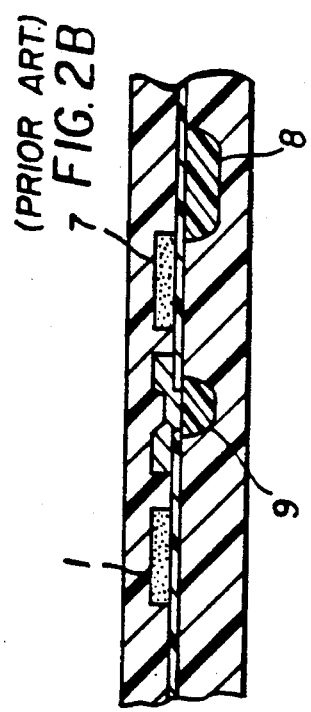
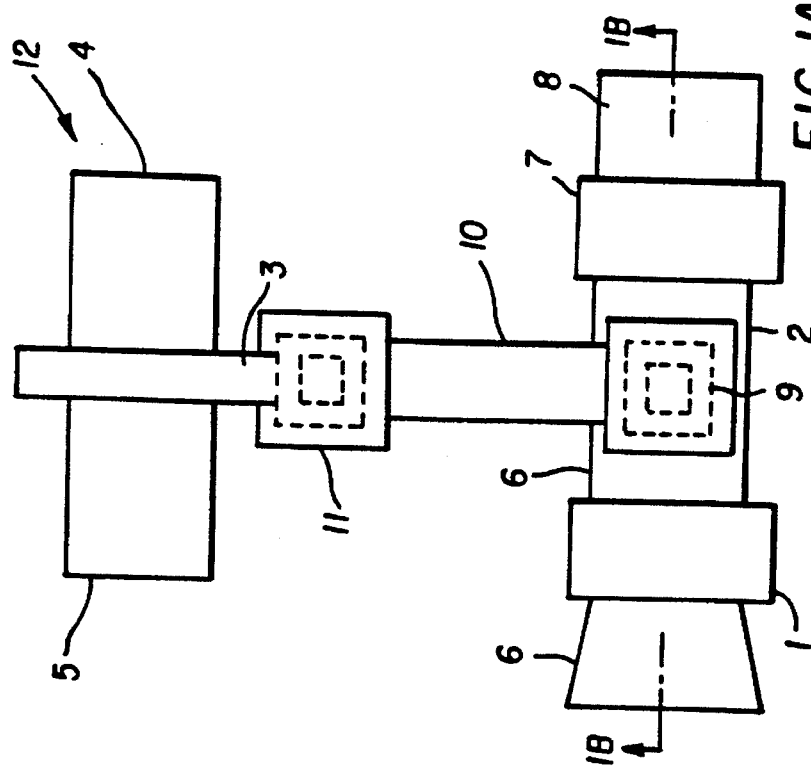
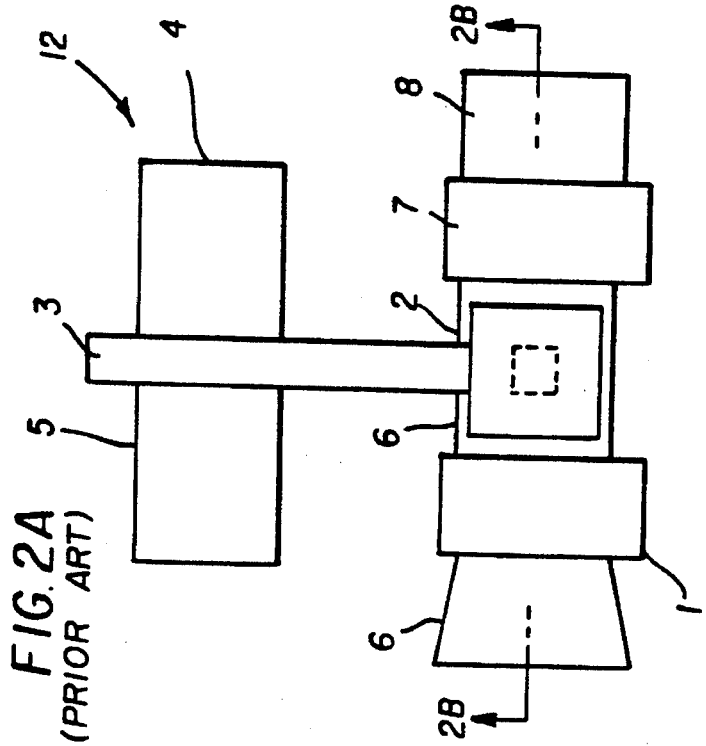

LOW CAPACITANCE FLOATING DIFFUSION STRUCTURE FOR A SOLID STATE IMAGE SENSOR

This is a continuation of application Ser. No. 08/491,791, filed 19 June 1995, now abandoned, which is a continuation of U.S. application Ser. No. 298,893, filed 31 August 1994, now abandoned, which is a divisional of U.S. application Ser. No. 188,500, filed 26 January 1994 now U.S. Pat. No. 5,387,536.

FIELD OF THE INVENTION

The invention relates to solid state image-sensors, and particularly to low capacitance floating diffusion structures in such a solid state image sensors.

BACKGROUND OF THE INVENTION

Solid state imager sensors operate by converting incident optical energy into charge that is spatially correlated to the incident optical image. In order to reconstruct and/or store the image in another medium, the photo-charge is typically converted into a voltage. As illustrated in FIGS. 1A–1B, this is usually accomplished by transferring the photo-charges from a storage region by means of an output gate 1, of a CCD image sensor for example, onto an integrated capacitor realized by a floating diffusion. A floating diffusion region 9 is connected to a gate electrode 3 of a MOS transistor which is part of the output amplifier. The MOS transistor also comprises a source region 4 and a drain region 5. During operation of an image sensor having parallel channels, charge samples are transferred to the floating diffusion region 9, which is electrically coupled to the gate electrode 3 of the MOS transistor. The voltage on the gate electrode of the output transistor is the input voltage to the output amplifier and is determined by the pixel charge transferred onto the floating diffusion. In order to prevent the voltage at the gate electrode 3 of the MOS transistor from being influenced by pixel charge samples that have previously been applied to the floating diffusion, a reset gate 7 is used to reset the floating diffusion to a reference potential determined by the reset drain 8 at a predetermined time after each pixel sample charge has been deposited on the floating diffusion. Each pixel charge is converted to a voltage by the relationship, V=Q/C; where V is voltage, Q is charge; and C is the capacitance of the floating diffusion.

In any application where light levels are inherently or preferably low, (such as copiers), it is desirable to make this capacitance as small as possible so that-the sensitivity, defined as dV/dQ, is large hence providing an adequate output voltage swing with lower illumination levels. The floating diffusion structure 2 is typically formed by a shallow implant 9 and contacted via metallization 10 that connects the floating diffusion region 9 to the gate electrode 3 of the MOS transistor, which is part of an amplifier. Such a system is described for example in U.S. Pat. No. 4,594,604 issued to Kub on Jun. 10, 1986. The net capacitance of such a floating diffusion is determined by the capacitance between the output gate electrode 1 of the associated solid state imager and the floating diffusion region 9, the capacitance between the reset gate electrode 7 and the floating diffusion region 9, the input capacitance of the amplifier, the parasitic capacitance associated with the metallization interconnect 10 and the connection to the MOS transistor gate electrode, and the junction capacitance of the floating diffusion region 9.

With such conventional systems, the parasitic capacitance is increased by the fact that this metallization interconnect 10 should be long enough to permit a connection with the transistor out of the active channel region 12 of the transistor (connection pad 11). In addition, the floating diffusion region is not the minimum geometry realizable due to the contact and interconnect scheme, hence the minimum junction capacitance is limited by the contact patterning resolution and the overlap required for alignment tolerances.

One method to minimize the net node capacitance of the floating diffusion was presented by K. Miwada et al "A 100 MHz Data Rate, 5000-Element CCD Linear Image Sensor With Reset Pulse Level Adjustment Circuit" IEEE International Solid-State Circuits Conference, Technical Digest, pp 168–169, 275, 1992. According to this approach, as illustrated in FIGS. 2A–2B of the drawings, the gate electrode 3 of the transistor is directly connected to the floating diffusion region 9 through a "buried contact". One possible process used to produce such a floating diffusion structure is illustrated in FIGS. 3A–3G of the drawings. In FIG. 3A, a gate oxide 30 is grown on a substrate 31 of a given conductivity type. In FIG. 3B, a buried contact 32 is patterned with photoresist 33 and etched. In FIG. 3C, a floating diffusion region 9 of a conductivity type opposite to the one of the substrate 31 is implanted or diffused. In FIG. 3D, a gate electrode 3 is deposited, patterned with a photoresist 34 and etched, the gate electrode 3 being in direct contact with the floating diffusion region 9. Also, during this step, the reset gate electrode 7 as well as the output gate electrode 1 of the image sensor can be formed. In FIG. 3E, the reset drain region 8 is patterned (photoresist 36) and implanted with an implant of the same conductivity type as the one of the floating diffusion region 9. During this implanting step the source/drain regions (not shown) of the MOS transistor are also implanted. In FIG. 3F, a dielectric 37 is deposited, patterned (photoresist 38) and etched to form contacts 39. In FIG. 3G, metallization 40 is deposited, patterned and etched for the above mentioned contacts. Even if such an approach eliminates the need for any metal interconnect between the floating diffusion 2 and the gate 3 of the MOS amplifier, it has some disadvantages. First it requires the addition of an extra mask and lithography sequence to the baseline image sensor process, i.e. to the standard single, double or more, level poly imager process. It also requires either direct contact of the gate oxide 30 with photoresist 33, or additional process steps to prevent direct contact. As a result, the yield and cost of the device is adversely affected.

SUMMARY OF THE INVENTION

Accordingly, it is an object of the present invention to provide an improved low capacitance floating diffusion structure in a solid state image sensor that overcomes the problems mentioned in the above discussion with respect to conventional methods.

This object is achieved by providing a method for producing a low capacitance floating diffusion structure of a solid state image sensor having an output amplifier provided with a gate electrode, comprising the steps of:

(a) growing a gate oxide on a substrate of a given conductivity type;

(b) forming the gate electrode for the output amplifier on the gate oxide and patterning the gate electrode so as to create an opening through it;

(c) introducing through the opening a dopant of a conductivity type opposite to the given conductivity type so as to create a floating diffusion region in the substrate; and (d) creating an ohmic contact between the floating diffusion region and the gate electrode.

This object is also achieved, in a solid state image sensor having an output amplifier having a gate electrode provided on a substrate of a given conductivity type, a floating diffusion structure comprising:

(a) a floating diffusion region in the substrate, the floating diffusion region being of a conductivity type opposite to the given conductivity and being self-aligned with the inner edges of an opening realized in the gate electrode; and (b) means for creating an ohmic contact between the floating diffusion region and the gate electrode.

The following are advantages of the present invention: a low capacitance floating diffusion structure is created without changing or adding steps to the baseline image sensor fabrication process; and the parasitic capacitance associated with the interconnect between the floating diffusion and the electrode is reduced and the size and capacitance of the floating diffusion is reduced.

BRIEF DESCRIPTION OF THE DRAWINGS

FIGS. 1A–1B illustrate a floating diffusion structure as known in the PRIOR ART;

FIGS. 2A–2B illustrate another floating diffusion structure of the PRIOR ART;

DETAILED DESCRIPTION OF THE PREFERRED EMBODIMENTS

Figure 3A:
FIGS. 3A–3G illustrate the prior art steps of the process used to produce the floating diffusion structure of FIGS. 2A–2B.
Figure 3B:
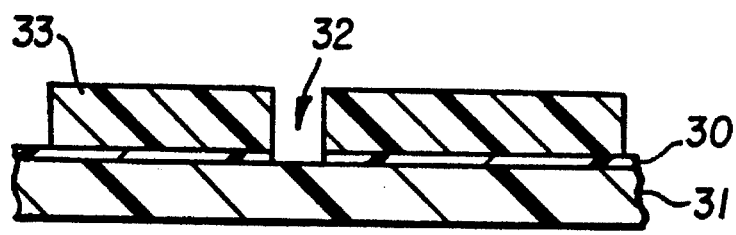
Figure 3C:
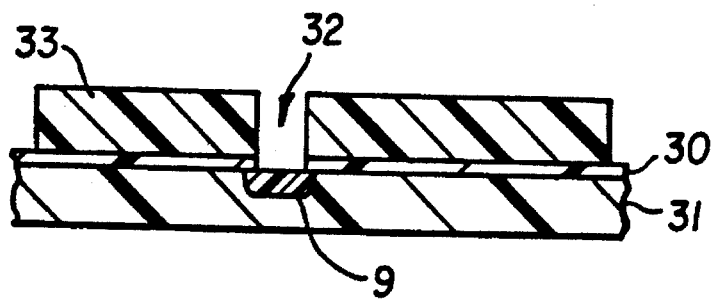
Figure 3D:
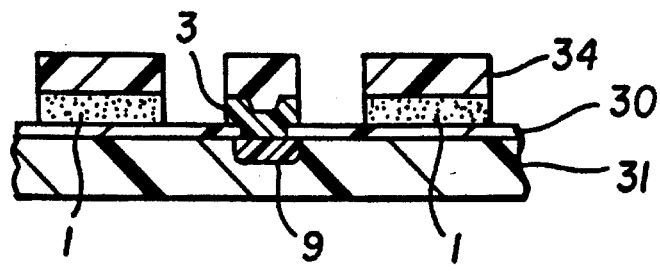
Figure 3E:
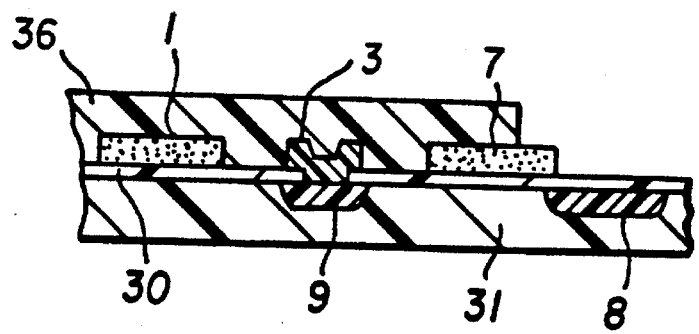
Figure 3F:
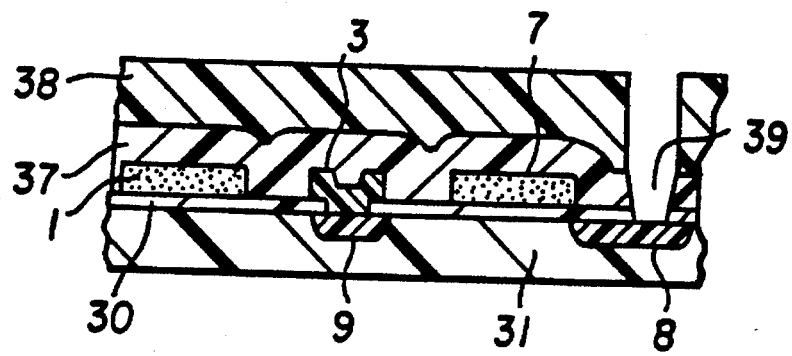
Figure 3G:
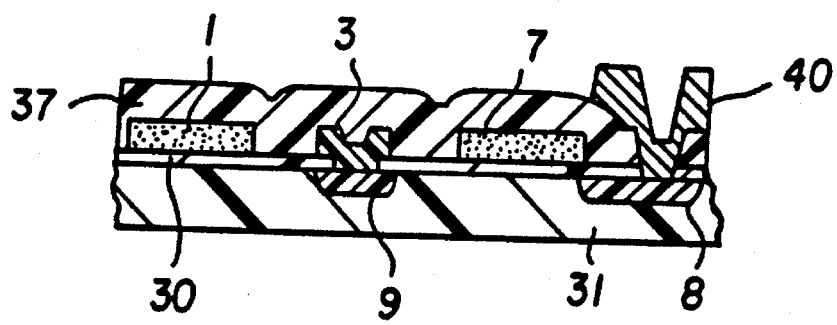
Figure 4A:
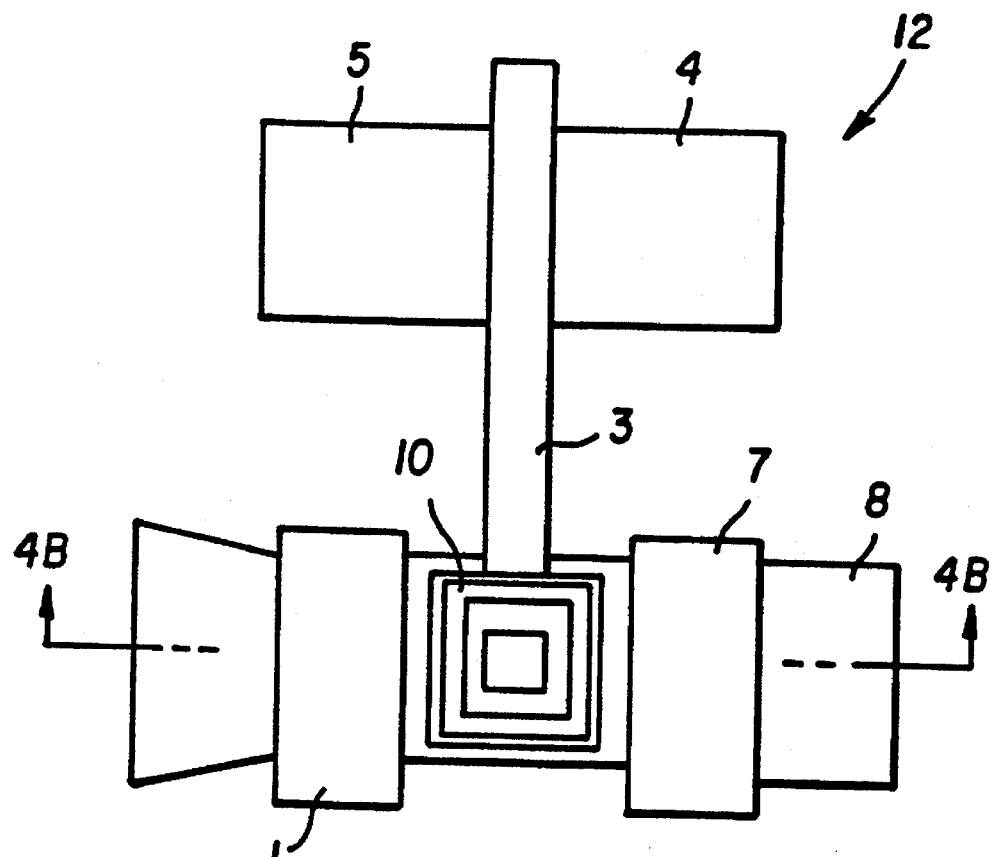
FIGS. 4A–4B show the floating diffusion structure of the invention.
Figure 4B:
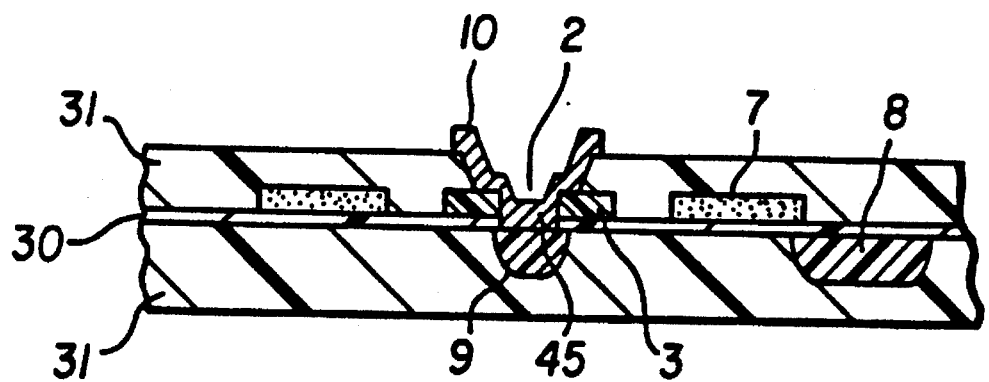

FIGS. 4A–4B to which it is now made reference illustrate the floating diffusion structure according to the invention. The floating diffusion structure obtained according to the invention is basically of the same type as the one described in reference to the prior art; the following description will emphasize the unique features of the structure according to the invention. Charges generated in the solid state image sensor (not shown) are transferred from CCD shift registers (for example) by means of an output gate 1, onto a integrated capacitor formed of a floating diffusion structure 2. The floating diffusion structure is comprised of a floating diffusion region 9 connected to the gate electrode 3 of a MOS transistor, which is part of an output amplifier. Such a transistor comprises a drain region 4 and a source region 5. The transfer of charges from the drain region to the source region is controlled by the potential which is applied to the gate electrode 3. In order to prevent the voltage at the gate electrode 3 of the output transistor from being influenced by pixel charge samples that have previously been applied to the floating diffusion, a reset gate 7 is used to reset the floating diffusion to a reference potential at a predetermined time after each pixel sample charge has been deposited in the floating diffusion, a reset drain 8 being provided to this end. The floating diffusion structure is comprised of a floating diffusion region 9, the edges of which, as shown in FIG. 4B are self-aligned with the edges of an opening created in the gate electrode 3. As it will be discussed in more detail hereafter, this floating diffusion region is produced by implanting dopant through an opening formed in the gate electrode, thus producing a self-alignment of the floating diffusion region with the edges of the opening in the gate electrode. A metallization interconnect 10 is applied on the floating diffusion structure to create an ohmic contact between the floating diffusion region and the gate electrode 3. Since the gate electrode of the MOS transistor forms the interconnect to the floating diffusion region, the area of the interconnect is drastically reduced compared to the floating diffusion structure discussed heretofore. Consequently, the capacitance resulting from this interconnection is also drastically reduced. Furthermore, due to the self-alignment of the floating diffusion region with the edges of the opening made in the gate electrode, a minimum size floating diffusion region is obtained. Accordingly, the capacitance associated with the floating diffusion region itself is reduced.

FIGS. 5A–5F illustrate the steps of a preferred embodiment of the method according to the invention.

Figure 5A:
FIGS. 5A–5F illustrate the steps of the method according to the invention.

In FIG. 5A, a gate oxide 30 is grown on a substrate of a given conductivity type. Advantageously such a substrate is a p-type substrate.

Figure 5B:
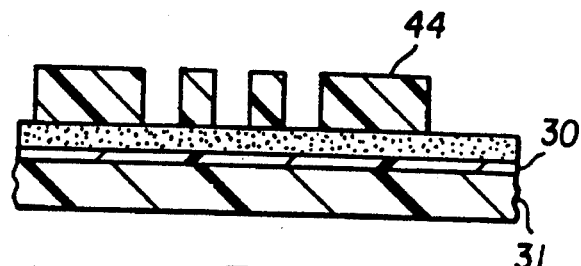
Figure 5C:
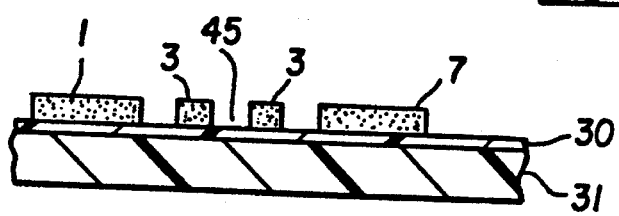

In FIGS. 5B–5C, a polysilicon layer (or other appropriate material) is formed on the gate oxide and, by means of a photoresist, the polysilicon layer is patterned and etched so as to form a gate electrode 3 for the MOS transistor 12. As it appears from FIG. 5C, the gate electrode 3 is patterned so that an opening 45 is formed through it. During this patterning step, the output gate electrode 1 of the solid state image sensor as well as the reset gate electrode 7 are also formed. Typically there can be one, two or three levels of gate electrodes in a solid state image sensor, and, even if not shown, all the gate electrodes of a given level of the solid state image sensor are preferably formed during this patterning step. The gate electrodes for the other levels are formed during subsequent patterning and etching steps.

Figure 5D:
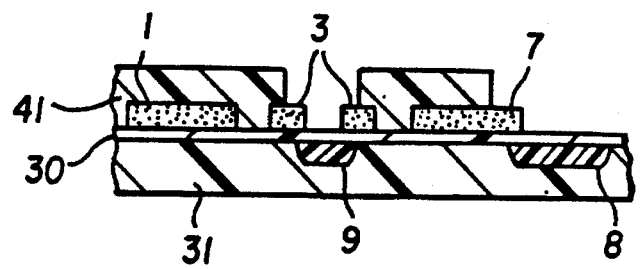

In FIG. 5D, the floating diffusion region 9 is formed by introducing into the substrate a dopant of a conductivity type opposite to the one of the substrate. For example, for a p-type substrate, a $n^+$-type dopant is used. Various techniques can be used for forming this region, such as, implanting or diffusion. One advantage of forming this region through an opening in the gate electrode lies in the fact that the floating diffusion region is self-aligned with the inner edges of the opening, thus limiting the size and capacitance of the floating diffusion region. As shown in FIG. 5D, the same dopant is used during this step for forming the reset drain region 8. Other regions, such as the source/drain region (not shown) of the MOS transistor as well as other source/drain regions on the solid state image sensor can be implanted during this step.

Figure 5E:
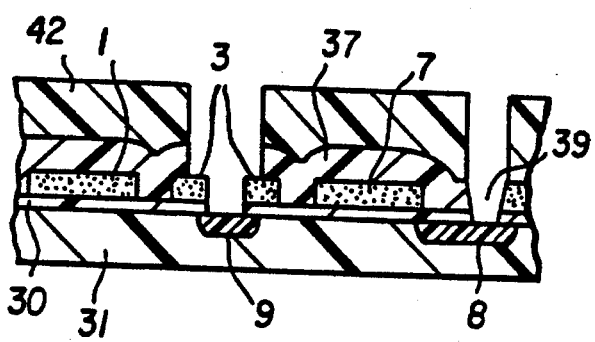

In FIG. 5E, a dielectric 37 is deposited, patterned (photoresist 42) and etched to form contacts 39.

Figure 5F:
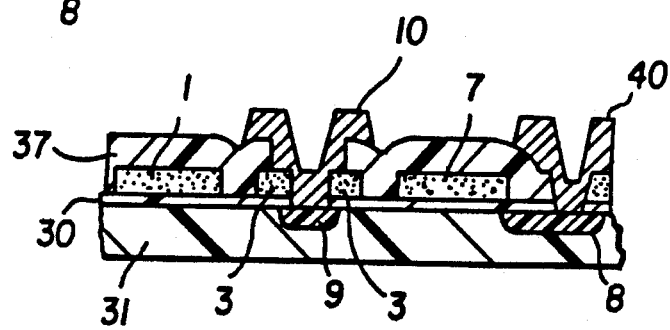

In FIG. 5F, an ohmic contact is formed between the floating diffusion region 9 and the gate electrode 3. This contact can be formed by metallization interconnect 10, such as aluminum. During this step, metallization is also deposited, patterned and etched for other contacts 40 of the image sensor.

From the above description, it should be clear that such a method does not add any further process steps to the standard single or double level poly imager process. This is not the case of the approach described by Miwada et al, in which extra masking and implanting steps are required.

The invention has been described in detail with particular reference to certain preferred embodiments thereof, but it will be understood that variations and modifications can be effected within the spirit and scope of the invention.

PARTS LIST 1 output gate electrode
2 floating diffusion structure
3 gate electrode
4 source region
5 drain region
6 channel
7 reset gate electrode
8 reset drain region
9 floating diffusion region
10 interconnect
11 connection pad
12 active channel region
30 gate oxide
31 substrate
32 buried contact
33 photoresist
34 photoresist
36 photoresist
37 dielectric
38 photoresist
39 contact
40 metallization
41 photoresist
42 photoresist
44 photoresist
45 opening

What is claimed is:

1. In a solid state image sensor having an output amplifier, said output amplifier having a gate electrode made from a first conductor material provided on a substrate of a given conductivity type, a floating diffusion structure comprising:

(a) a floating diffusion region in said substrate, said floating diffusion region being of a conductivity type opposite to said given conductivity and being self-aligned with the inner edges of an opening realized in said gate electrode; and (b) means for creating an ohmic contact between said floating diffusion region and said gate electrode, said means for creating an ohmic contact comprising a second material formed within said opening of said electrode.

2. A floating diffusion structure according to claim 1 wherein said substrate is a p-type substrate.

3. A floating diffusion structure according to claim 2 wherein said floating diffusion region is a $n^+$-type region.

4. The invention of claim 1 wherein said first conductor material is polysilicon.

5. A solid state image sensor comprising:

a substrate doped to have a first conductivity type;

an output amplifier having a gate electrode formed on said substrate, said gate electrode formed out of a conductive material and patterned to have an opening formed therein;

a floating diffusion region in said substrate, said floating diffusion region being formed from material essentially opposite in conductivity to said first conductivity type, formed such that it is self-aligned with the inner edges of said opening realized in said gate electrode; and a conductive region formed between said floating diffusion region and said gate electrode, said conductive region comprising a conductive material different from said conductive material used to form the gate electrode.

6. The invention of claim 5 wherein said first conductive material further comprises polysilicon.

7. The invention of claim 5 wherein said conductive region further comprises a metal.

* * * * *